United States Patent [19]

Utaka et al.

[11] Patent Number: 4,826,291

[45] Date of Patent: May 2, 1989

[54] METHOD FOR MANUFACTURING DIFFRACTION GRATING

[75] Inventors: Katsuyuki Utaka, Musashino; Shigeyuki Akiba, Tokyo; Yuichi Matsushima, Tanashi, all of Japan

[73] Assignee: Kokusai Denshin Denwa Kabushiki Kaisha, Tokyo, Japan

[21] Appl. No.: 882,588

[22] Filed: Jul. 7, 1986

[30] Foreign Application Priority Data

Jul. 16, 1985 [JP] Japan ........................ 60-155236
Mar. 7, 1986 [JP] Japan ........................ 61-48500

[51] Int. Cl.$^4$ ........................ G02B 5/18; G02B 5/32

[52] U.S. Cl. ........................ 350/320; 350/3.7; 350/162.2; 430/299

[58] Field of Search ........................ 350/320, 162.17; 430/299, 162.2, 3.7

[56] References Cited

U.S. PATENT DOCUMENTS 4,660,934 4/1987 Akiba et al. ........................ 350/320

*Primary Examiner*—Bruce Y. Arnold
*Attorney, Agent, or Firm*—Emmanuel J. Lobato; Robert E. Burns

[57] ABSTRACT

A method is disclosed for manufacturing a diffraction grating formed by corrugations reversed in phase between a first region and a second region through use of two kinds of photoresists of opposite photosensitive characteristics. An isolation film is introduced for preventing the photoresists from getting mixed with each other, permitting the combined use of any photoresists. A step may be further included in which the isolation film is deposited on one of two kinds of photoresist films in at least one of a first region and a second region, is subjected to two-beam interference exposure, is removed and then a degraded layer, which is formed in the surface of the above said one kind of photoresist film during the deposition of the isolation film, is removed.

6 Claims, 5 Drawing Sheets

METHOD FOR MANUFACTURING DIFFRACTION GRATING

BACKGROUND OF THE INVENTION

The present invention relates to a method for manufacturing a diffraction grating formed by periodic corrugations, through utilization of two-beam interference exposure, and more particularly to a method of making a diffraction grating of a structure in which corrugations are reversed in phase between two adjacent regions.

Since a diffraction grating formed by periodic corrugations reflects therefrom or passes therethrough light of a desired wavelength alone, it has found use, in the field of optical communications, as a filter or an internal element of distributed feedback semiconductor lasers (which will hereinafter referred to simply as "DFB" lasers).

Of such lasers, a DFB laser of the type having a diffraction grating disposed in or near its light emitting region emits light of a single longitudinal mode; hence, this laser has been highlighted as a light source for optical communications, and a variety of proposals have been made thereon. Especially in recent years, it has attracted attention to reverse the phase of corrugations in the vicinity of the central portion of the diffraction grating for further stabilization of the single mode operation.

The oscillation wavelength of such a DFB laser is determined by the period Λ of the corrugations of the diffraction grating, and the stability of its operation depends upon the accuracy of fabrication of the diffraction grating. Accordingly, the accuracy of fabrication of the diffraction grating will influence the characteristics of the DFB laser.

SUMMARY OF THE INVENTION

The present invention is intended to obviate the abovesaid defects of the prior art, and an object of the invention is to provide a method for manufacturing diffraction grating with which it is possible to obtain a diffraction grating of the phase-reversed periodic corrugations structure by the employment of a two-beam interference exposure process which is simple and easy and excellent in mass-productivity as compared with the electron beam exposure process.

The feature of the present invention resides in that in the manufacture of the diffraction grating formed by corrugations reversed in phase between first and second regions through use of two kinds of photoresists of opposite photosensitive characteristics, an isolation film is introduced for preventing the both photoresists from getting mixed with each other, permitting the combined use of any photoresists.

BRIEF DESCRIPTION OF THE DRAWINGS

The present invention will be described in detail below in comparison with the prior art with reference to accompanying drawings, in which.

DETAILED DESCRIPTION

A description will be given first of a method for manufacturing a diffraction grating of the type in which corrugations are not reversed in phase, and then of a conventional manufacturing method of a diffraction grating formed by phase-reversed corrugations.

Figure 1:
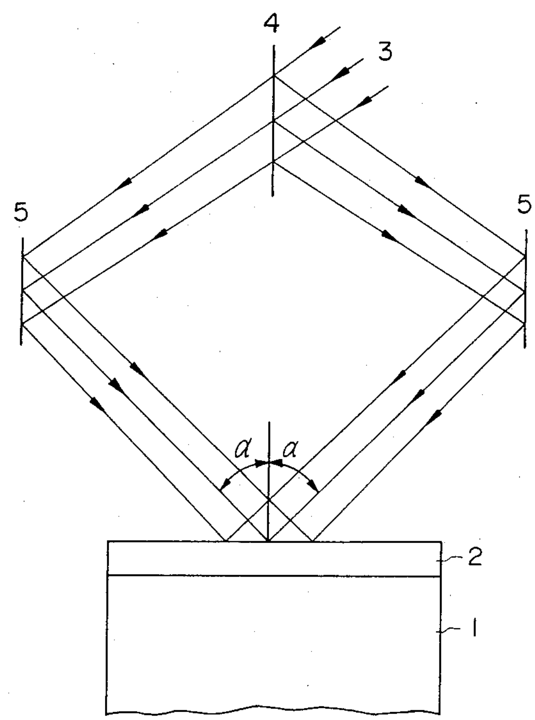
FIG. 1 is a diagram explanatory of the principles of a conventional two-beam interference exposure method.

FIG. 1 is a schematic diagram explanatory of the principles of conventional fabrication of a uniform diffraction grating through use of a two-beam exposure technique. For instance, He-Cd laser light 3 of a wavelength $\lambda_0$ is split by a half mirror 4 into two, and each light is reflected by one of mirrors 5 and applied to the top surface of a substrate 1, together with the light reflected by the other mirror, as shown. A crystal surface formed by, for example, coating a positive photoresist film 2 on the substrate 1 is thus exposed to an interference pattern resulting from irradiation by the composite rays of light 3. By developing and selectively etching away the exposed substrate surface, the diffraction grating can be obtained. Now, letting the incident angle of the laser light 3 be represented by α, the period Λ of the corrugations is given by the following equation:

$$\Lambda = \frac{\lambda_0}{2 \sin\alpha} \qquad (1)$$

On the other hand, a method of exposure by electron beam scanning under control of a computer has been proposed for the fabrication of a diffraction grating having the structure in which corrugations are phase-reversed at the center of the laser. With this method, parts corresponding to grooves of the diffraction grating are irradiated successively by electron beam scanning. This method is applicable to a case where the period Λ of the corrugations is long; but when the period Λ is short (about 2000 Å) in case of a firstorder diffraction grating in which the period Λ is one-half the wavelength λ of light in the crystal, the limit of resolution will be reached, making it essentially difficult to manufacture the diffraction grating. Furthermore, the electron beam exposure method involves sequential scanning of individual grooves, and hence consumes an appreciable amount of time for scanning the entire area of the diffraction pattern; therefore, this method is not suitable for use in mass-production process.

Next, a description will be given of problems which are encountered with in producing, through use of the two-beam interference exposure technique, a diffraction grating of the structure in which the corrugations in adjoining regions are reverse in phase from each other.

Figure 2:
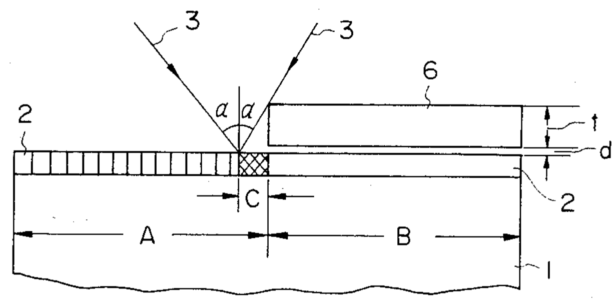
FIG. 2 is a diagram schematically showing the fabrication of a diffraction grating having phase-reversed corrugations through utilization of a conventional two-beam interference exposure technique.

(1) FIG. 2 is a schematic diagram showing the fabrication of a diffraction grating of a phase-reversed or 180° out-of-phase corrugations structure by the employment of the aforementioned two-beam interference exposure process. In this instance, regions A and B are separately exposed through metal masks. FIG. 2 shows a step of forming periodic corrugations in the region A, during which the region B is covered with a metal mask 6 having a thickness t (approximately 50 μm). Usually, the metal mask is spaced (about several μm) apart from the photoresist film 2, as indicated by d. In FIG. 2, an interference pattern is shown to be formed as close to the region B as possible. As seen from FIG. 2, however, there will remain a region C which is not exposed to the irradiation by the laser light 3 owing to the thickness of the metal mask 6, that is, where no corrugations are formed. The two-beam interference exposure of the region B, which takes place after forming the metal mask 6 above the region A, will also leave a similar region C where no corrugations are formed. In consequence, no corrugations will be provided over an area twice the region C as a whole.

Assuming, for instance, that the period $\Lambda$ of the corrugations of the diffraction grating is 2400 Å and the wavelength $\lambda_0$ of the He-Cd laser light is 3250 Å, the incident angle $\alpha$ is given as follows:

$$\alpha = \sin^{-1}\left(\frac{\lambda_0}{2\Lambda}\right) = \sin^{-1}\left(\frac{3250}{4800}\right) \simeq 43 \text{ [degrees]}.$$

Letting the thickness t of the mask be equal to 50 $\mu$m and a gap between the mask and the photoresist film be represented by d, the region C where no corrugations will be formed is as follows:

$$C=(t+d)\tan\alpha \approx t\cdot\tan\alpha = 47\ [\mu m].$$

Therefore, the corrugation-free region, which accompanies a two-beam interference exposure operation, is twice as large as the region C, that is, 94 [$\mu m$]. This will not only increase the working current of the DFB laser but also make its single-wavelength operation unstable because the entire length of the light emitting region is usually several hundreds [$\mu m$]. This problem could be somewhat solved by decreasing the thickness t of the metal mask 6 or tapering off the upper edge of the inner side of the metal mask 6, but there will still remain the region C with no corrugations.

(2) In order to displace the corrugations by 180 degrees apart in phase, the substrate 1 must be moved accurately by a distance (approximately 1000 Å) equal to one-half the period $\Lambda$ of the corrugations when exposing the region B subsequent to the exposure of the region A. It is extremely difficult, however, to move the substrate 1 accurately about 1000 Å (0.1 $\mu$m); this is very difficult from the viewpoint of reproducibility as well.

As described above, it has been difficult, with the conventional two-beam interference exposure technique, to manufacture a diffraction grating of the type that the periodic corrugations are phase-reversed, and the electron beam exposure method has also posed a problem in terms of mass-productivity.

The present invention will hereinafter be described in detail with reference to the accompanying drawings.

[EXAMPLE 1]

FIGS. 3A to 3G are explanatory of a first example according to a first invention of the present application, schematically illustrating a sequence of steps involved in the manufacture of a diffraction grating of phase-reversed corrugations. This example will be described in connection with a case of employing positive and negative photoresists as first and second photoresists and a SiN film as an isolation film.

Figure 3A:
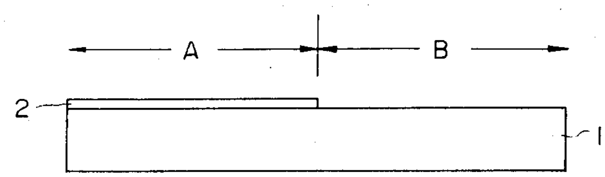
FIGS. 3A to 3G, 4A to 4F, 5A to 5G and 6A to 6G are cross-sectional views explanatory of manufacturing steps of diffraction gratings according to the present invention.

(1) First Step (a) A positive photoresist (hereinafter referred to as the "P" film) 2 is coated, as a first photoresist, on a substrate 1 and is then subjected to ordinary photolighography so that it remains unremoved only in the region A as shown in FIG. 3A. In this instance, the positive photoresist 2 remaining in the region A is of an unexposed state.

Figure 3B:
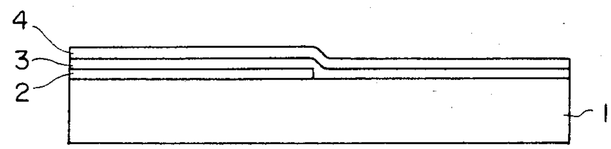

(b) Next, an isolation film, for example, a SiN film 3 is formed over the entire area of the top surface of the substrate 1, which is the feature of the present invention. Furthermore, a negative photoresist film (hereinafter referred to as the "N" film) 4 is coated all over the SiN film as shown in FIG. 3B. Incidentally, the influence of the formation of the SiN film 3 on the P film 2 can be minimized by the use of an ECR (Electron Cyclotron Resonance) method which permits deposition of the SiN film at room temperature.

Figure 3C:
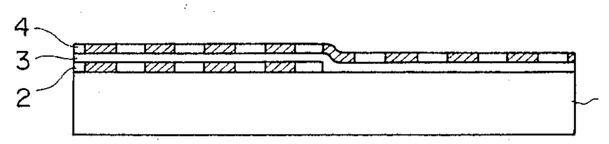

(2) Second Step (c) The entire surface of the substrate 1 is uniformly subjected to two-beam interference exposure. In FIG. 3C, hatching indicates the exposed portions. Since the SiN film 3 is excellent in transmittivity of light, the P film 2 can also be exposed at the same time.

Figure 3D:
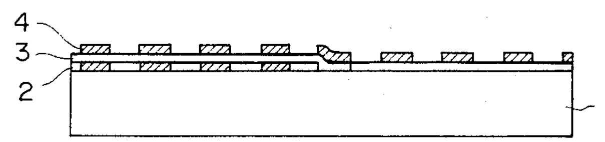

(3) Third Step (d) The N film 4 is developed, obtaining a uniform diffraction grating of the N film 4, as shown in FIG. 3D.

Figure 3E:
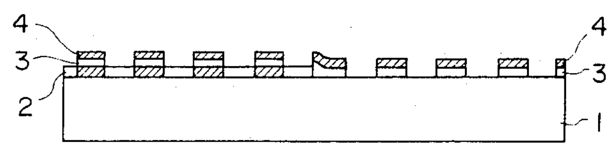

(e) Next, the SiN film 3 in the regions A and B is selectively etched away with buffered fluoric acid, as shown in FIG. 3E, using as a mask the diffraction grating formed by the N film 4.

Figure 3F:
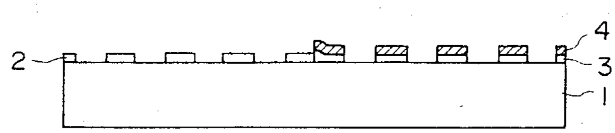

(f) The P film 2 in the region A is developed so that the P film 2 exposed is removed while the SiN film 3 and the N film 4 in the region A can be simultaneously removed by lift-off phenomena, obtaining a diffraction grating which is formed by the P film 2 and the SiN film 3 and in which periodic corrugations in the regions A and B are opposite in phase from each other. In the development of the P film 2, the N film on the SiN film 3 in the region B may sometimes be removed or remain unremoved, as shown in FIG. 3F, but this will not affect the results of this step.

Figure 3G:

(g) The substrate 1 is subjected to chemical etching through the diffraction grating formed by the P film 2 in the region A and the diffraction grating formed by the isolation film 3 in the region B, by which it is possible to form on the substrate 1 a diffraction grating whose corrugations are reversed in phase at the center thereof, as shown in FIG. 3G.

While in the above the P film 2 and the N film 4 are formed as the first and second photoresist films, respectively, it is also possible to use the N film 4 as the first photoresist film and the P film 2 as the second photoresist film.

[EXAMPLE 2]

FIGS. 4A to 4F are explanatory of a second example of the first invention of the present application, schematically illustrating a sequence of manufacturing steps involved in a case where the isolation film is used for only one of the regions.

Figure 4A:
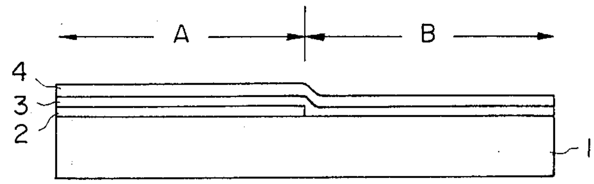

(1) First Step (a) The P film 2 is coated on the substrate 1 and is then left unremoved only in the region A through the ordinary photolithography, followed by forming the SiN film 3 and the N film 4 over the entire area of the substrate surface in the order mentioned, as shown in FIG. 4A.

Figure 4B:
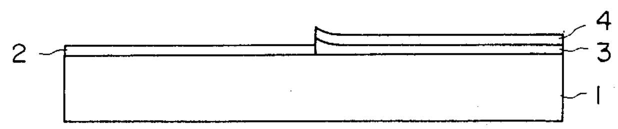

(b) After lightly exposing only the region B by an ordinary masked exposure process, the N film 4 is developed and the SiN film 3 is etched away using the N film as a mask, thus leaving the P film 2 alone in the region A, as shown in FIG. 4B. By reducing the masked exposure time, it is possible that the N film 4 in the area B remains substantially unexposed.

Figure 4C:
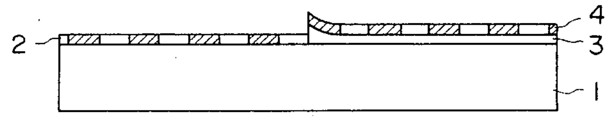

(2) Second Step (c) The substrate 1 is subjected to uniform two-beam interference exposure all over its surface, as shown in FIG. 4C. The hatching indicates the exposed portions.

Figure 4D:
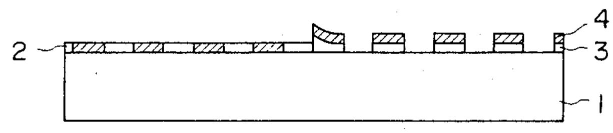

(3) Third Step (d) The N film 4 in the region B is again developed, and the SiN film 3 is selectively etched away, as shown in FIG. 4D, through the remaining N film serving as a mask. In this instance, the P film 2 is hardly developed since a developer for a novolak negative photoresist of high resolution is usually small in pH value, that is, low in alkalinity. Even if the P film is developed, it does not matter.

Figure 4E:
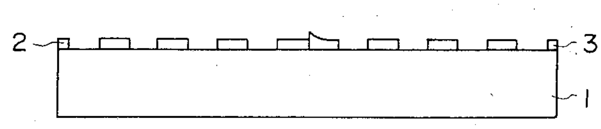

(e) Next, the P film 2 in the region A is developed. In this case, the N film 4 may sometimes be developed so that the P film 2 exposed is melted away owing to a difference in pH value between the negative photoresist developer and the positive photoresist developer, but it does not matter; moreover, even if the N film 4 remains unremoved on the SiN film 3, it does not matter either. As a result of the above steps, there are formed by the P film and the SiN film 2 in the regions A and B diffraction grating the periodic corrugations which are reverse in phase from each other, as shown in FIG. 4E.

Figure 4F:
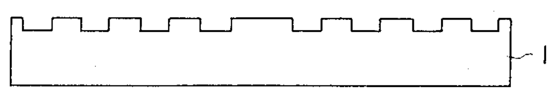

(f) The substrate 1 is subjected to chemical etching through the diffraction gratings acting as a mask, thereby obtaining a diffraction grating whose corrugations are phase-reversed at the center of the substrate, as shown in FIG. 4F. In this example, "lift-off" techniques having critical conditions are not necessary.

[EXAMPLE 3]

FIGS. 5A to 5G are explanatory of an example of a second invention of the present application, schematically illustrating a sequence of manufacturing steps involved in a case of using the isolation film only in the region in which the P film 2 and the N film 4 are both formed and reversing the first and second photoresist films employed in Example 1.

(1) First Step (a) The N film 4, the SiN film 3, and the P film 2 are deposited in succession all over the surface of the substrate 1, and then only the region B is subjected to the ordinary masked exposure. The hatching in FIG. 5A indicates the exposed portions.

Figure 5A:
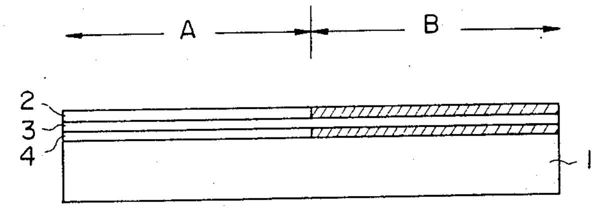
Figure 5B:
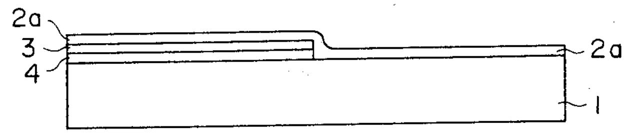

(b) After developing the P film 2 so as to remove the exposed portions and selectively etching away the SiN film 3 and the N film 4 in the region B alone, a P film 2*a* is coated again all over the surface of the substrate 1, as shown in FIG. 5B. In this instance, the precoated P film 2 and the re-coated P film 2*a* get mixed with each other as if only the P film 2*a* is newly coated. Although different reference numerals are employed for the P film 2 and the P film 2*a* in the interest of clarity, they are the same positive photoresist.

Figure 5C:
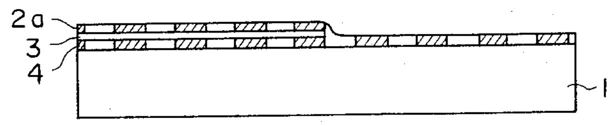

(2) Second Step (c) The entire surface of the substrate 1 is subjected to uniform two-beam interference exposure, as shown in FIG. 5C.

Figure 5D:
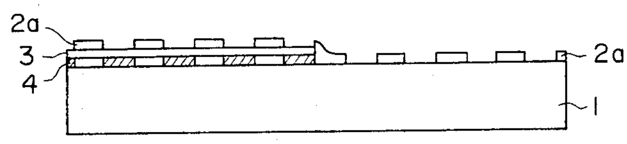

(3) Third Step (d) The P film 2*a* in the both regions is developed, providing a diffraction grating of the P film 2*a* on the substrate surface in the regions A and B, as shown in FIG. 5D.

Figure 5E:
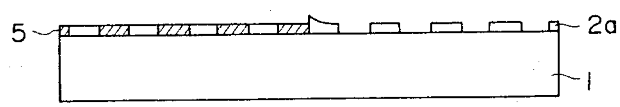

(e) The SiN film 3 in the region A is completely removed by etching, as shown in FIG. 5E.

Figure 5F:
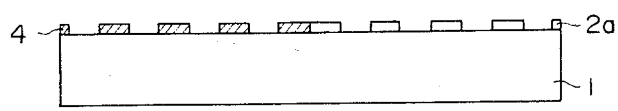

(f) The N film 4 in the region A is developed. As a result of the above steps, there are formed by the N film 4 and the P film 2*a* in the regions A and B diffraction gratings the periodic corrugation which are reversed in phase from each other, as shown in FIG. 5F.

Figure 5G:

(g) The substrate surface is subjected to chemical etching through the abovesaid diffraction gratings, thereby obtaining a diffraction grating whose corrugations are phase-reversed at the center of the substrate 1, as shown in FIG. 5G.

As described above, according to the present invention, the formation of an isolation film between negative and positive photoresist films permits the fabrication of the diffraction grating having the structure in which the left- and right-hand corrugations are phase-reversed from each other, even by the combined use of photoresist materials which would otherwise readily get mixed with each other. While in the above examples the SiN film is employed as the isolation film, it may also be substituted with a dielectric film such as a $SiO_2$ film, a metallic film, or an organic material film which would not mingle with the photoresist materials.

The manufacturing methods above-mentioned involve the formation of an insulation film (an isolation film), by which it is possible to fabricate a diffraction grating formed by corrugations of opposite phases in first and second regions, through use of two kinds of photoresists of reverse photosensitivity characteristics and by one two-beam interference exposure step. These methods are simple and easy and excellent in mass-productivity.

However, these manufacturing methods have a problem in the reproducibility in a photoresist developing process which follows the etching of the isolation film, and has the drawback that the shape of the corrugations may sometimes be partly disturbed, resulting in the configuration of the diffraction grating being somewhat degraded.

The above-mentioned problem can be effectively eliminated by the following examples of the present invention, which is characterized by the inclusion of a step in which the isolation film deposited on one of two kinds of photoresist films in at least one of first and second regions, subjected to two-beam interference exposure, is removed and then a degraded layer, which is formed in the surface of the abovesaid one photoresist film during the deposition of the isolation film, is removed.

[EXAMPLE 4]

FIGS. 6A to 6G are explanatory of a third example according to a first invention of the present application, schematically illustrating a sequence of steps involved in the manufacture of a diffraction grating of phase-reversed corrugations. This example will be described in connection with the case of employing positive and negative photoresists for first and second photoresist films and a SiN film as an isolation film for preventing them from mingling together.

Figure 6A:
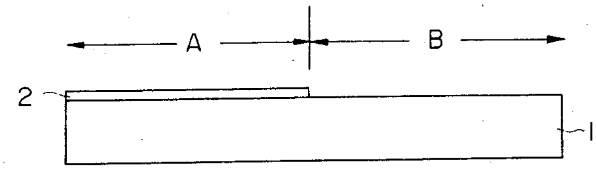

(1) First Step (a) A positive photoresist (hereinafter referred to as the "P" film) 2 is coated, as a first photoresist, on a substrate 1 and is then subjected to ordinary photolithography so that it remains unremoved only in the region A, as shown in FIG. 6A. In this instance, the positive photoresist 2 remaining in the region A is of an unexposed state.

Figure 6B:
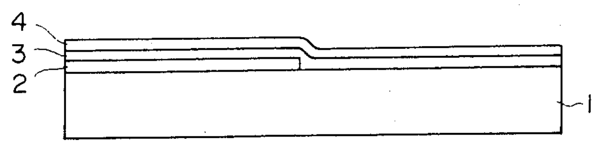

(b) Next, an isolation film, for example, a SiN film 3 is formed over the entire area of the top surface of the substrate 1, which is the feature of the present invention. Furthermore, a negative photoresist film (hereinafter referred to as the "N" film) 4 is coated all over the SiN film, as shown in FIG. 6B. Incidentally, the influence of the formation of the SiN film 3 on the P film 2 can be minimized by the use of an ECR method which permits deposition of the SiN film at room temperature.

Figure 6C:
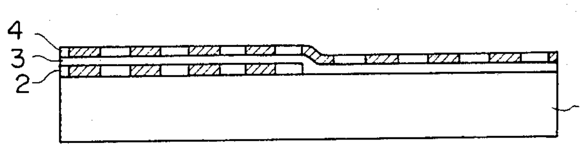

(2) Second Step (c) The entire surface of the substrate 1 is uniformly subjected to two-beam interference exposure. In FIG. 6C, hatching indicates the exposed portions. Since the SiN film 3 is excellent in transmittivity of light, the P film 2 can also be exposed at the same time.

Figure 6D:
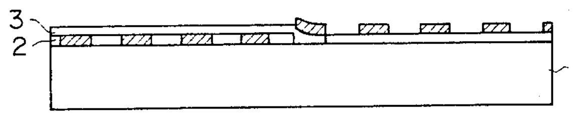

(3) Third Step (d) The N film 4 is developed. In this case, the N film having a multilayer structure in the region A is developed faster than the N film in the region B. By a suitable selection of the development time, it is possible to provide a diffraction grating by the N film in the region B and expose the SiN film in the region A, as shown in FIG. 6D.

Figure 6E:
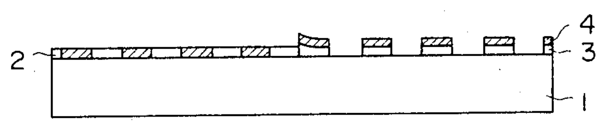

(e) Next, the SiN film 3 in the regions A and B is selectively etched away with buffer fluoric acid, as shown in FIG. 6E, using as a mask the diffraction grating formed by the N film 4. As a result of this, the P film 2 is exposed in the region A; then the surface of the P film 2 is etched with a plasma of oxygen, which is the feature of this example of the present invention. This etching is intended to remove a degraded layer which is slightly formed in the surface of the P film 2 during the deposition of the SiN film thereon in the step (b) and which would degrade the configuration of the corrugations, if not removed.

Figure 6F:
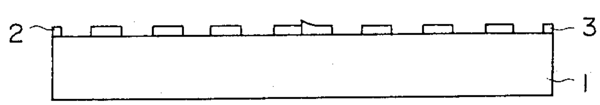

(f) The P film 2 in the region A is developed so as to remove the exposed parts, obtaining a diffraction grating which is formed by the P film 2 and the SiN film 3, as shown in FIG. 6F, and in which periodic corrugations in the regions A and B are opposite in phase from each other. In the development of the P film 2, the N film on the SiN film 3 in the region B may sometimes be removed or remain unremoved, as shown, but this will not affect the results of this step.

Figure 6G:

(g) The substrate is subjected to chemical etching through the diffraction grating formed by the P film 2 in the region A and the diffraction grating formed by the isolation film 3 in the region B, by which it is possible to form on the substrate 1 a diffraction grating whose corrugations are reversed in phase at the center thereof and have a good configuration, as shown in FIG. 6G.

While in the above the P film 2 and the N film 4 are formed as the first and second photoresist films, respectively, it is also possible to use the N film 4 as the first photoresist film and the P film 2 as the second photoresist film.

[EXAMPLE 5]

The Example 2 described with reference to FIGS. 4A to 4F can be improved, in which the third step is modified as follows:

(3) Third Step (d) The N film 4 in the region B is developed, and the SiN film 3 is selectively etched away through the remaining N film serving as a mask. In this instance, the P film 2 is hardly developed since a developer for a novolak negative photoresist of high resolution is usually small in pH value, that is, low in alkalinity. Even if the P film is developed, it does not matter. (FIG. 4D)

(e) A very small degraded layer in the surface of the P film is removed by plasma etching as in Example 1, after which the P film 2 in the region A is developed. In this case, the N film 4 may sometimes be developed owing to a difference in pH value between the negative photoresist developer and the positive photoresist developer, but it does not matter; moreover, even if the N film 4 remains unremoved on the SiN film 3, it does not matter either. As a result of the above steps, there are formed by the P film and the SiN film 2 in the regions A and B diffraction grating the periodic corrugations of which are reverse in phase from each other and has a good configuration. (FIG. 4E)

(f) The substrate 1 is subjected to chemical etching through the diffraction gratings acting as a mask, thereby obtaining a diffraction grating whose corrugations are phase-reversed at the center of the substrate. (FIG. 4F)

[EXAMPLE 6]

The Example 3 described with reference to FIGS. 5A to 5G can be improved, in which the third step is modified as follows:

(3) Third Step (d) The P film 2*a* in the both regions is developed, providing a diffraction grating of the P film 2*a* on the substrate surface in the regions A and B. (FIG. 5D)

(e) The SiN film 3 in the region A is completely removed by etching. (FIG. 5E)

(f) The N film 4 in the region A is developed after removal of a very thin degraded layer in the film surface by means of plasma etching as in the afore-mentioned examples. As a result of the above steps, there are formed by the N film 4 and the P film 2*a* in the regions A and B diffraction gratings the periodic corrugations which are reversed in phase from each other. (FIG. 5F)

(g) The substrate surface is subjected to chemical etching through the abovesaid diffraction gratings, thereby obtaining a diffraction grating whose corrugations are phase-reversed at the center of the substrate 1 and have a good configuration. (FIG. 5G)

As described above, according to the present invention, a diffraction grating which is formed by uniform corrugations of a good configuration can be fabricated by removing a degraded layer which is formed in the photoresist film surface during the formation of an isolation film between negative and positive photoresist films for preventing them from getting mixed together. While in the above examples the SiN film is employed as the isolation film, it may also be substituted with a dielectric film such as a $SiO_2$ film, a metallic film, or an organic material film which would not mingle with the photoresist materials.

As will be appreciated from the above-described manufacturing steps, according to the present invention, negative and positive photoresist films are isolated by an isolation film from each other so that the novolak positive and negative photoresists of high resolution can be utilized in combination which, if coated directly one on the other, would get mixed with each other. Moreover, a degraded layer which is formed in the photoresist film surface during the deposition of the isolation film is removed; this ensures the fabrication of a high resolution diffraction grating having phase-reversed corrugations of a good configuration while retaining the advantage of the two-beam interference exposure technique. Accordingly, the present invention is applicable to stable DFB lasers of excellent characteristics and is of great utility in practical use.

What we claim is:

1. A method for manufacturing diffraction grating comprising: a first step of forming a first photoresist film on a substrate surface in a first region and an isolation film over the entire area of the substrate surface and a second photoresist film in succession in a second region of the substrate surface different from the first region, the photosensitive characteristic of the second photoresist film being reverse from that of the first photoresist film; a second step of subjecting the substrate surface to two-beam interference exposure; and a third step of forming a diffraction grating of the first photoresist film in the first region and a diffraction grating of at least the isolation film in the second region by developing the second photoresist film, etching the isolation film, and developing the first photoresist film, and then forming on the substrate a diffraction grating of a structure having corrugations reversed in phase between the first and second regions by etching the substrate through the diffraction grating of the first photoresist film in the first region and the diffraction grating of the isolation film in the second region as a mask.

2. A method for manufacturing diffraction grating according to claim 1, characterized in that said third step further includes plasma etching the surface of the first photoresist film before said developing.

3. A method for manufacturing a diffraction grating comprising: a first step of forming in succession a negative photoresist film, an isolation film and a positive photoresist film over an entire area of a substrate surface including a first region and a second region contiguous with the first region; a second step of subjecting the entire substrate surface to two-beam interference exposure; and a third step of forming a diffraction grating of the negative photoresist film in the first region and a diffraction grating of the positive photoresist film in the second region by developing the positive photoresist film, etching the isolation film, and developing the negative photoresist film, and then forming on the substrate a diffraction grating of a structure having corrugations reversed in phase between the first and second regions by etching the substrate through the diffraction gratings of the negative and positive photoresist films as a mask.

4. A method for manufacturing a diffraction grating according to claim 3, in which said third step further includes plasma etching the surface of the negative photoresist film before said developing.

5. A method for manufacturing a grating according to claims 1 or 2 or 3 or 4, in which one of a dielectric, metallic, and organic material is used for forming the isolation film.

6. A method for manufacturing a diffraction grating comprising: a first step of forming at least a first photoresist film on a substrate in a first region and an isolation film and a second photoresist film in succession in a second region different from the first region and contiguous therewith, the photosensitive characteristic of the second photoresist film being reverse from that of the first photoresist film; a second step of subjecting the substrate surface to two-beam interference exposure; and a third step of forming a diffraction grating of the first photoresist film in the first region and a diffraction grating of at least the isolation film in the second region by developing the second photoresist film, etching the isolation film, and developing the first photoresist film, and then forming on the substrate a diffraction grating of a structure having corrugations reversed in phase between the first and second regions by etching the substrate through the diffraction grating of the first photoresist film in the first region and the diffraction grating of the isolation film in the second region as a mask.

* * * * *